United States Patent [19]

Johannessen

[11] 4,151,528

[45] Apr. 24, 1979

[54] METHOD OF AND APPARATUS FOR UNAMBIGUOUS RADIO NAVIGATION

[75] Inventor: Paul R. Johannessen, Lexington, Mass.

[73] Assignee: Megapulse, Incorporated, Bedford, Mass.

[21] Appl. No.: 785,367

[22] Filed: Apr. 7, 1977

[51] Int. Cl.² .......................... G01S 1/24; H03K 3/02
[52] U.S. Cl. .................................... 343/103; 307/108
[58] Field of Search ................ 343/103; 307/106, 108

[56] References Cited

U.S. PATENT DOCUMENTS 3,711,725  1/1973  Johannessen ..................... 307/108

Primary Examiner—Maynard R. Wilbur
Assistant Examiner—Richard E. Berger
Attorney, Agent, or Firm—Rines and Rines

[57] ABSTRACT

This disclosure deals with the use of groups of unambiguous radio-frequency pulse transmissions for Loran C and similar radio navigation, eliminating cycle-selection ambiguity and reducing the required power level for transmission.

21 Claims, 12 Drawing Figures

METHOD OF AND APPARATUS FOR UNAMBIGUOUS RADIO NAVIGATION

The present invention relates to radio navigation apparatus and methods, being more particularly concerned with navigation systems such as Loran C and the like which involve receiver selection of particular radio-frequency (RF) cycles in the pulses transmitted for navigation determination.

Among the problems attendant upon present Loran C radio navigation systems and the like, are the difficulties associated with appropriate cycle selection at the receivers of the transmitted ratio frequency (RF) pulses, and the high power required of the transmitting systems. Highly effective transmitters are described, for example, in U.S. Pat. Nos. 3,889,263, 3,786,334, and 3,711,725, and appropriate receivers for enabling reliable reception, for example, in U.S. Pat. Nos. 3,882,504 and 3,921,076.

Figure 1A:
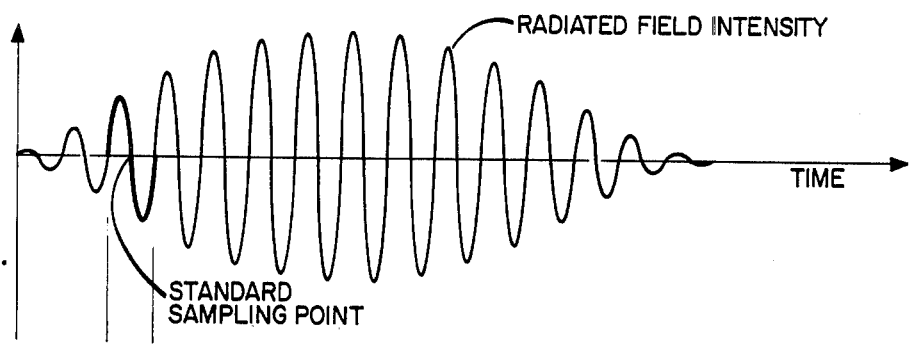

A typical Loran-C pulse, for example, is a tear-shaped envelope of a plurality of successive radio-frequency cycles, more steeply rising than falling as shown in later-described FIG. 1A. Receivers operating with groups of such pulses select the third RF cycle of the pulse during their cycle selection process and then track the RF zero crossing of this third cycle as described in the above-mentioned receiver patents. This zero crossing is referred to as "The Standard Sampling Point", and the time-of-arrival of this zero crossing contains the precise timing information. Sometimes, however, the receiver may select the wrong cycle (the second or the fourth, for example), due to distortion in the leading edge of the envelope or slight misadjustment of the cycle-selection processing circuitry in the receiver. Such distortion in the pulse envelope may, for example, be caused by propagation anomalies; in particular, over land.

The parameter that determines how well the envelope is maintained relative to the ideal envelope is referred to as "The Envelope-to-Cycle Discrepancy," or "ECD". Most receivers have available a measure of ECD from envelope tracking circuitry; but, in general, it has been a troublesome parameter. The trouble arises when ECD becomes large and is interpreted by conventional receivers as incipient trouble. Some receivers react by reverting to the search mode in the hope of finding new signals; others interpret the problem as cycle slippage and jump a cycle; while others just light warning lights indicating incipient trouble.

In accordance with the present invention, such cycle ambiguity is admirably resolved, and with a reduction in required transmission power, by transmitting a coded group of RF pulses that provides unambiguous cycle selection using essentially the same signal format as presently used, for example, in the Loran-C radio navigation system, and provides unambiguous position location with position repeatabilities of a few feet and at ranges of several hundred nautical miles. It is thus an object of the invention to provide such a new and improved radio navigation method and apparatus.

A further object is to provide a novel radio pulse apparatus and technique or more general applicability, as well.

Other and further objects will be explained hereinafter and are delineated in the appended claims. By transmitting a waveform including a unique single navigation cycle that enables an unambiguous cycle selection, all the information necessary for navigation is maintained, the signal-to-noise ratio is unaffected, the cycle ambiguity problem is resolved at the receiver, and the required transmitter power is reduced by an order of magnitude.

In summary, from one of its broad aspects, the invention embraces a method of Loran radio navigation and the like, that comprises, generating a single navigation cycle as a unique intermediate part of a waveform of several half cycles of radio-frequency energy, and transmitting the same as the complete navigation pulse, receiving this pulse transmission and selecting the unique zero crossing of the single cycle thereof for timing information.

In accordance with the invention, moreover, new circuits are also disclosed that use solid-state switching relays or devices, SCR's, sometimes in combination with magnetic pulse compression techniques, to provide efficient and inexpensive means for generating the desired antenna current waveform, as will hereinafter be explained.

Figure 2A:
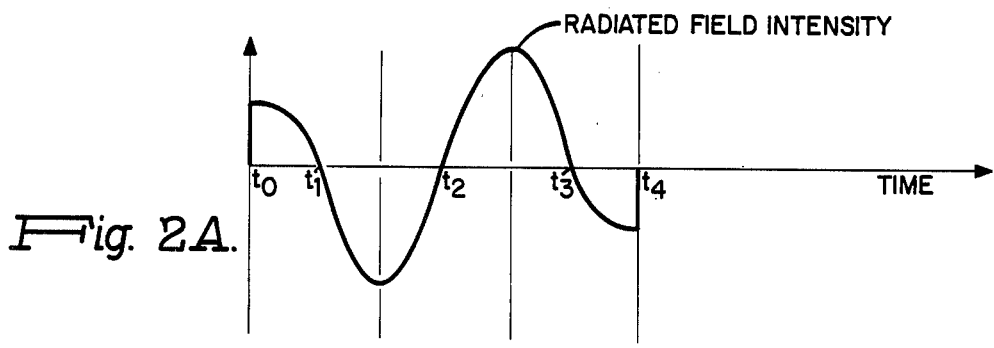
Figure 3:
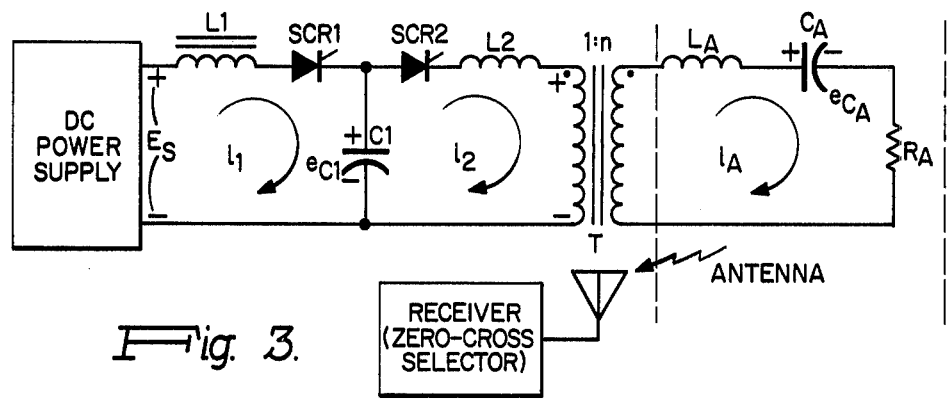
Figure 4A:
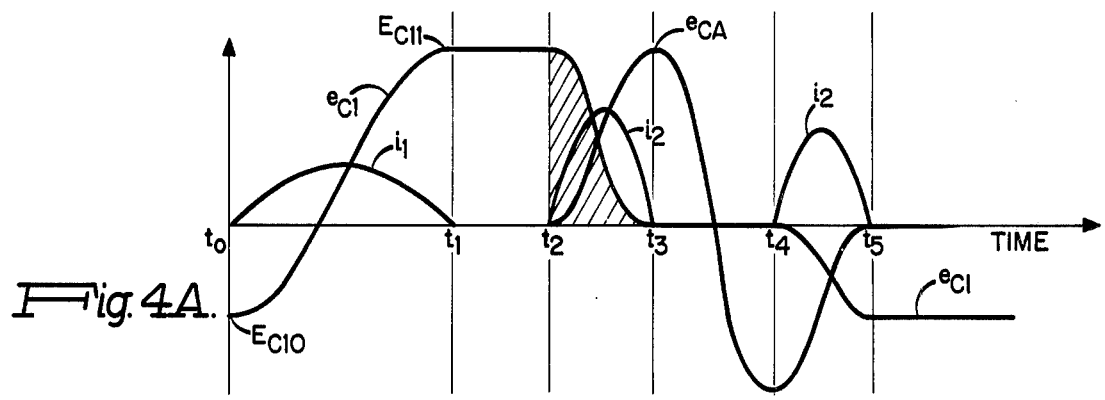
Figure 5:
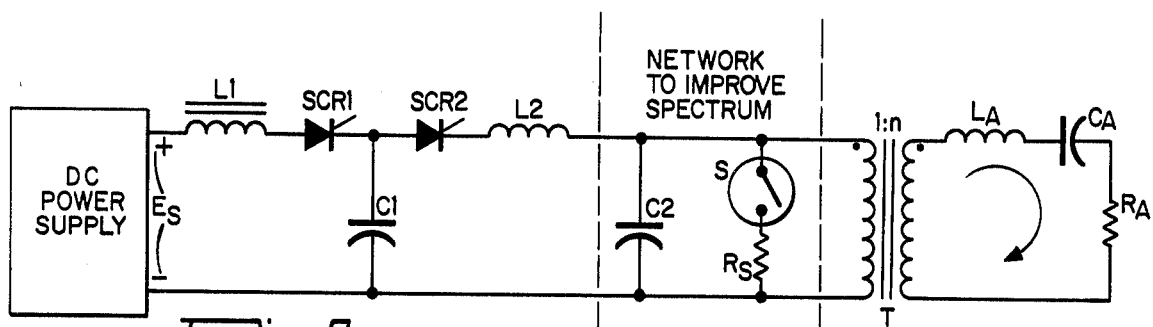
Figure 6A:
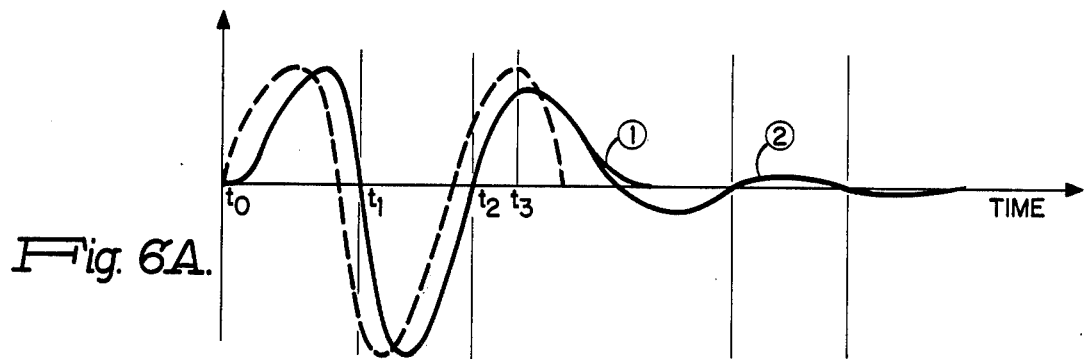

The invention will now be described with reference to the accompanying drawings, FIGS. 1(A), (B), (C), and (D) of which are waveform graphs of a conventional Loran C RF pulse, a desired single-cycle pulse, and its antenna currents and voltages;

FIGS. 2(A) and (B) are similar waveforms of a preferred unambiguous navigation cycle pulse of the invention comprising a unique part of several half-cycles or parts thereof of a transmitted or radiated waveform, and the antenna current and voltage associated therewith;

FIG. 3 is a schematic circuit diagram of a preferred apparatus for carrying out the method underlying the invention;

FIGS. 4(A) and (B) are waveforms illustrating the timing and operational voltages and currents generated in the apparatus of FIG. 3;

FIG. 5 is a schematic circuit of a transmitter apparatus with an additional network to improve the radiated spectrum; and FIGS. 6(A) and (B) are waveforms illustrating the effect of the additional network for the spectrum improvement.

Figure 1B:
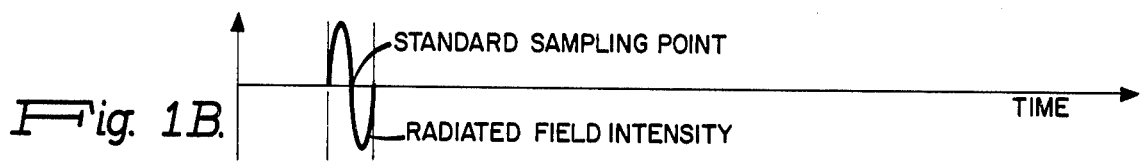
Figure 1C:
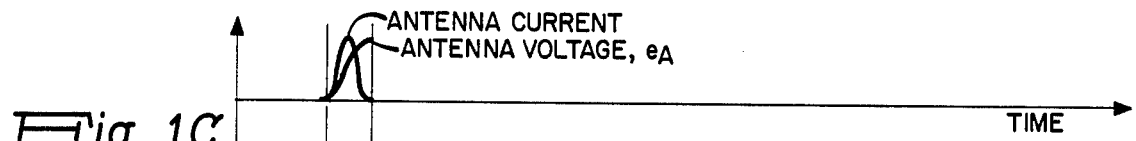
Figure 1D:
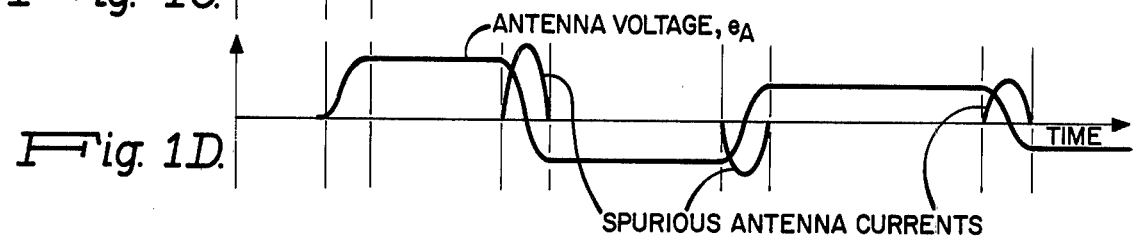

While providing the striking advantages of cycle-selection accuracy at the receiver and reduced power transmitter requirements, this new system does introduce certain difficulties (which are also overcome by the invention) which may explain the previous lack of obviousness of this approach to those skilled in this art. It is evident that the transmission of an electromagnetic field consisting of one single cycle of RF, as shown in FIG. 1(B), would achieve the objectives of this invention. However, there are certain practical problems associated with the generation of a radiated pulse having a field intensity in the form of a single cycle of RF. Since the waveform of the radiated electromagnetic fields (E and B fields) is equal to the time derivative of the antenna current, the antenna current waveform required to generate a radiated single cycle electromagnetic field must be of the form shown in FIG. 1(C). To generate an antenna current waveform of this type is not practical in the monopole type antennas used in hyperbolic navigation systems and which provide the desired uniform radiated field pattern. A monopole antenna is characterized by a capacitance to ground which, together with the antenna tower inductance, radiation and ground resistances, forms a series resonant circuit. Thus, a unipolar antenna current of the form shown in FIG. 1(C) charges up the antenna capacitance so that a large amount of energy remains on the antenna at the termination time of the radiated pulse. The antenna voltage $e_A$ resulting from this charge is shown in FIG. 1(D), and is impressed upon the output transformer of the transmitter, driving the transformer into saturation. When the output transformer saturates, it becomes a low impedance, causing the antenna capacitance to discharge and reverse polarity. This reverse antenna voltage, in turn, drives the output transformer into saturation in the opposite direction, causing the antenna capacitance to discharge and again reverse polarity. This action will repeat until all the antenna energy is dissipated in the radiation and loss resistances of the antenna system. For every antenna capacitance voltage reversal, a half-cycle of antenna current is generated. This causes spurious signals to be transmitted which are detrimental to the navigation function of the transmitting system. For this reason, the generation of the single-cycle field-intensity waveform shown in FIG. 1(B) is not practical when using monopole antennas.

This problem is overcome in this invention by transmitting an electromagnetic field having the waveform shown in FIG. 2(A). This waveform consists of several (four) half-cycles of alternating polarity. The first and fourth half-cycles have respective steep leading and trailing edges, being otherwise substantially sinusoidal, and are low in amplitude with respect to the intermediate complete second and third substantially sinusoidal half-cycles that together form a complete unique single cycle. The complete single cycle of interest is formed by the second and third half-cycles of the overall radio-frequency pulse waveform and provides a unique zero-crossing slope, being referred to herein for identification as the navigation cycle. The principal objective of this invention is to generate a propagating field that makes possible an unambiguous identification of the navigation cycle. It is evident from the waveform of FIG. 2(A) that such navigation cycle has the following unique characteristics:

1. The sum amplitude of the navigation (single) cycle is significantly greater than the sum amplitude of any other complete cycle formed out of this total waveform, such as first and second half-cycles, and third and fourth half-cycles.

2. The navigation cycle has opposite polarity to the other cycles; or equivalently, the zero crossing slope value at time $t_2$ in FIG. 2(A) is unique.

These two characteristics allow an unambiguous indentification of the navigation cycle, the waveform of FIG. 2(A) providing the same advantages with regard to cycle selection as the bare single-cycle waveform of FIG. 1(B) that is impractical for monopole antenna use as before explained, but may be useful in other applications as later explained.

Figure 2B:
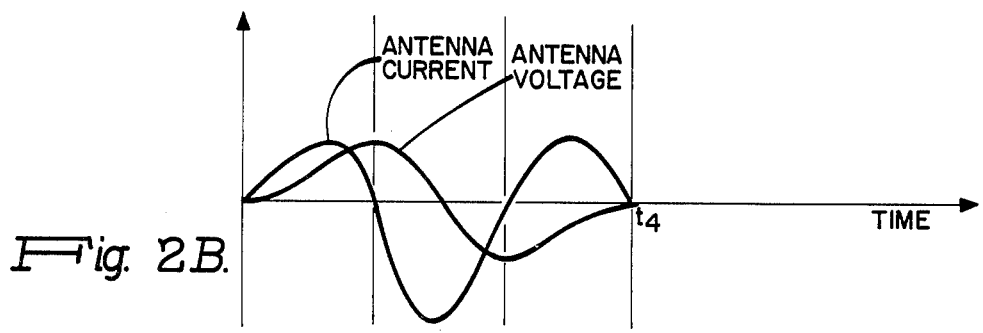

To generate the radiated field intensity of the desired waveform of FIG. 2(A) from a monopole antenna, requires an antenna current waveform as shown in FIG. 2(B), with the resulting antenna voltage also there shown and so-labelled. Both the antenna voltage and current go to zero at the end of the pulse; that is, time $t_4$ in FIGS. 2(A) and (B). Thus, no energy remains on the antenna at time $t_4$, so that no spurious signals can be generated.

A schematic circuit diagram of a preferred embodiment of the transmitter power stage is shown in FIG. 3, and the voltage and current waveforms of this circuit are shown in FIGS. 4(A) and (B). A D.C. power supply, so-labelled, is shown applying voltages $E_s$ to a network comprising a first section containing a series-connected inductor L1 and a solid-state switching relay or trigger-control device SCR1 or the like, and shunt capacitor C1. The next section of the network comprises a further switching device SCR2 series-connected to inductor L2 and the primary winding of transformer T. The secondary winding of transformer T is connected to the antenna, schematically illustrated as series-connected inductance $L_A$, capacitance $C_A$ and resistance $R_A$.

The operation of the circuit of FIG. 3 is as follows. Assume initially that capacitor C1 is charged negatively to the value $E_{c10}$, FIG. 4(A). At time $t_o$, SCR1 is turned ON and the charging of capacitor C1 is initiated. During the charging interval of C1, $t_o$ to $t_1$ in FIG. 4(A), the voltage $e_{c1}$ on capacitor C1 is reversed; and at time $t_1$, the charging current $i_1$ is reduced to zero and the voltage on capacitor C1 has reached its maximum value $E_{C11}$.

Figure 4B:
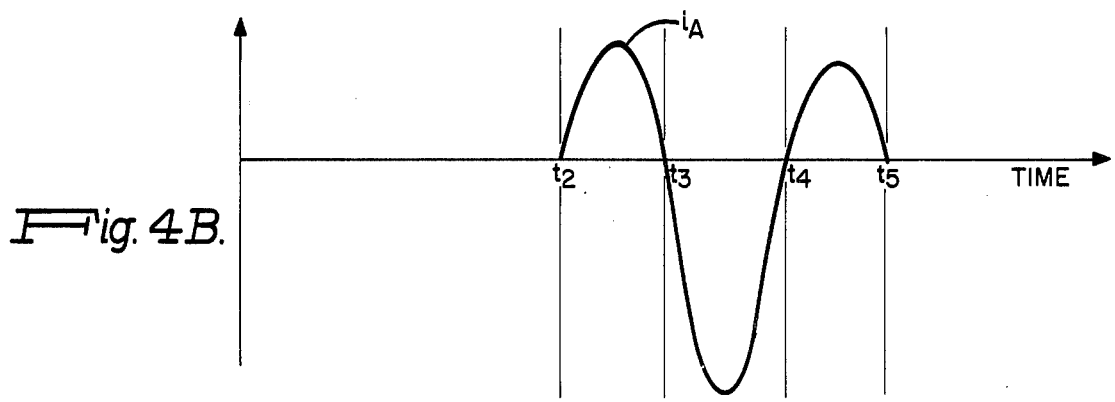

In the time-interval $t_1$ to $t_2$, this voltage on C1 remains constant and provides adequate reverse recovery time for SCR1. At time $t_2$, SCR2 is turned ON, and the energy on C1 is transferred via the transformer T to the antenna capacitance $C_A$ during the time interval $t_2$ to $t_3$. The turns ratio 1:n of the transformer T is selected such that the capacitance C1 is matched to the capacitance $C_A$ so that all the energy on C1 is resonantly transferred by current $i_2$ to $C_A$ through transformer T and inductor $L_A$. Thus, during the time-interval $t_2$ to $t_3$, the voltage on C1 goes to zero, the voltage on $C_A$ goes from zero to its maximum value, and a first half-cycle of radio-frequency antenna current $i_A$ is generated, as shown in FIG. 4(B).

During the time-interval from $t_2$ to $t_3$, the C1 capacitor voltage is impressed across the primary winding of transformer T. This voltage drives the transformer core into saturation. At time $t_3$, the transformer saturates and forms a low impedance path to the antenna circuit. Thus, the antenna capacitance $C_A$ discharges through $L_A$ $R_A$ and the saturated transformer secondary inductance. Since this resonant circuit has a high Q, the voltage $e_{CA}$ on $C_A$ reverses to a negative value very close to its initial positive value, as also shown in FIG. 4(A). As a result, a second, this time negative, half-cycle of antenna current flows, FIG. 4(B), in the time-interval from $t_2$ to $t_3$ of magnitude very close to twice the antenna current magnitude of the first half-cycle of $i_A$. The circuit is tuned by means of inductors L2 and $L_A$ in combination with the saturated secondary transformer inductance such that the width, half period or time duration of the first two antenna circuit half-cycles are the same.

At time $t_4$, the voltage on C2 has reversed and the current $i_A$ is reduced to zero. Thus, in the interval from $t_4$ to $t_5$, the voltage $e_{CA}$ drives the transfomer T out of saturation and, since SCR2 is still in a conductive state, the energy on $C_A$ is transferred or fed back to C1 through the inductors L2, LA, the transformer T and SCR2. This energy transfer generates a positive third half-cycle of antenna current, FIG. 4(B), the magnitude of which is slightly less than the first half-cycle, but with the same time duration; this amplitude difference representing the energy dissipated in the radiation resistance of the antenna and circuit losses. At the end of the time-interval from $t_4$ to $t_5$, the capacitor C1 is charged to the negative voltage $E_{C10}$, the initially assumed voltage on C1. Thus, the circuit has restored the remaining energy and is ready for the generation of the next RF pulse. It should be noted that all the reactive energy has been recovered and is available for use in the generation of the next pulse. Thus, optimum circuit efficiency has been obtained, and only a relatively small amount of prime power is required. This is as distinguished from conventional Loran transmitters wherein all of the stored energy is dissipated in the antenna and antenna pulse forming networks (tailbiters). The antenna current waveform of FIG. 2(B), required for generation of the unambiguous navigation pulse of the invention, FIG. 2(A), is achieved. These pulses will be repetitively generated in successive time separation as is conventional in such Loran and related preselected time interval transmission operations. The unique navigation cycle RF pulses transmitted by the antenna $L_A$-$C_A$-$R_A$ are received in navigation receivers, so-labelled, provided with zero-crossing selecting circuits as described in the receiver patents above-referenced and the publications cited therein.

Figure 6B:
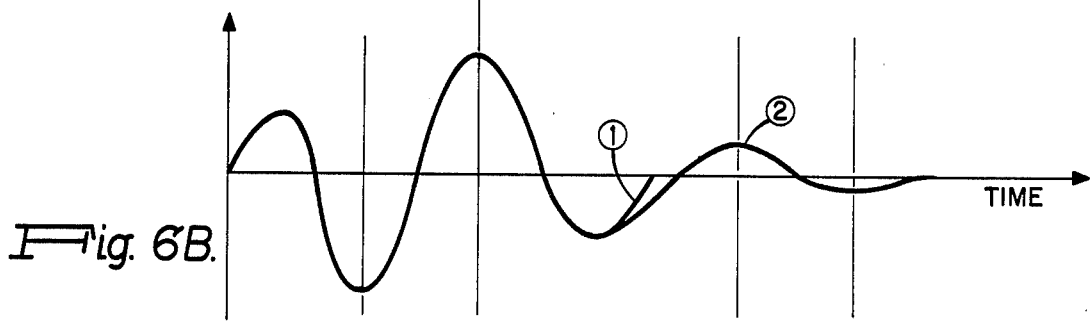

While useful in some applications, one disadvantage of the radiated field intensity wave shape of FIG. 2(A) is its wide spectral bandwidth that may cause serious interference with other radio navigation or communication systems. In particular, the discontinuities at the beginning and end of the radiated pulse generate high-frequency spectral components that can cause interference with other equipment. Considerable improvement in the pulse spectrum can be obtained in accordance with the invention, and without degrading the navigational properties, by modifying the generation of the current pulse shape to that shown in FIG. 6(B). This pulse has no discontinuities in its waveform; and if an oscillatory tail is acceptable, only one slope discontinuity at the beginning of the pulse. Such a modified pulse can be generated by adding a shunt section to the circuit of FIG. 3. This new circuit is shown in FIG. 5, in which the added network consists of a shunt capacitor C2 in parallel with a series interconnection of a switch S and a resistor $R_s$. The switch S preferably consists of solid-state switching relays or devices such as SCR's or transistors. The operation of this circuit is as follows.

During the initial part of the pulse generation process, switch S is open, and capacitor C2, together with inductor L2, forms a filter that smooths out the antenna current slope discontinuity at the beginning of the pulse, as shown in FIG. 6(A). The dotted line in FIG. 6(A) is the waveform of the original current pulse generated by the circuit of FIG. 3, and the solid line is the waveform of the new improved antenna current pulse. The filter formed by L2 and C2, however, will not eliminate the slope discontinuity at the end of the pulse. This slope discontinuity is eliminated by closing switch S some time during the time-interval of the third half-cycle of antenna current. During this time-interval, the energy stored in the antenna is transferred back to the transmitter circuit. Closing of the switch S during this time-interval interrupts this energy transfer, and the antenna energy dissipates instead in the resistor $R_s$. If the switch S is closed early in this time interval, all of the antenna transfer energy dissipates in the resistor $R_s$. If the switch S is closed late in this time-interval, only a small part of the transfer energy is dissipated in $R_s$; thus, maintaining the high transmitter efficiency. When switch S is closed, capacitor C2 rapidly discharges through $R_s$ so that the reverse C1 voltage appears across SCR2, thereby turning it OFF. The remaining energy in the antenna circuit generates an exponentially decaying oscillatory wave of antenna current, as shown by curve 2 in FIG. 6(A). By adjusting the resistor $R_s$ such that the circuit formed by the elements C2, $R_s$, T, $L_A$, $C_A$, and $R_A$ is critically damped, the antenna current decays exponentially to zero, as shown by curve 1 in FIG. 6(A). Minimum damping is obtained by reducing the resistor $R_s$ to zero value. This condition results in the longest exponentially decaying oscillatory antenna current pulse tail, which, in turn, generates the least amount of harmonic energy.

While the invention has been described in connection with its preferred application to Loran C and similar navigation systems, its advantages may also be used in other systems, if desired. If other types of antennas than monopole antennas or those of similar characteristics are to be used, there may indeed be useful application for the single or navigation cycle portion alone of the waveform of FIG. 2(A), in which event the first and fourth half-cycles would be adjusted by proper circuit parameters, as is well known, to be minimal or substantially zero. Further modifications will also occur to those skilled in this art, and such are considered to fall within the spirit and scope of the invention as defined in the appended claims.

What is claimed is:

1. A method of Loran radio navigation and the like, that comprises, generating and transmitting a single cycle of radio-frequency energy as an intermediate part of a several half-cycle-waveform navigation pulse, the single cycle being unique as to at least one of sum amplitude and zero crossing slope value within the navigation pulse waveform, receiving the pulse transmission and selecting the unique single cycle zero crossing for timing information.

2. A method as claimed in claim 1 and in which the sum amplitude of said single cycle of radio-frequency energy is different from the sum amplitude of any other cycle formed out of said waveform.

3. A method as claimed in claim 2 and in which the said single cycle sum amplitude is greater than the sum amplitude of any other cycle formed out of said waveform.

4. A method as claimed in claim 1 and in which the value of the slope of the said single cycle zero crossing is unique within said waveform.

5. A method of Loran radio navigation and the like, that comprises, generating a unique single cycle of radio-frequency energy and transmitting the same as an intermediate part of a several half-cycle-waveform navigation pulse, receiving the pulse transmission and selecting the unique single cycle zero crossing for timing information, said single cycle being generated by storing energy from a power source, transferring the energy to an antenna circuit to generate from part thereof a first half-cycle of radio-frequency current, resonating the current in the antenna circuit to generate an opposite polarity second half-cycle of the radio-frequency current, and feeding back the energy remaining in the antenna circuit to the source to generate thereby a third half-cycle of radio-frequency current of the same polarity as the first half cycle in the antenna circuit while re-storing remaining energy for subsequent use.

6. A method as claimed in claim 5 and in which the path for said feeding back is made resonant to the desired radio frequency in order to cause the second and third half cycles to have the same time duration as the first half cycle.

7. A method as claimed in claim 6 and in which the half-cycle amplitudes are adjusted such that the second half cycle is of greater amplitude than the first and third half cycles.

8. A method as claimed in claim 1 and in which said generating and transmitting is repeated at preselected successive time intervals to generate groups of time-separated navigation pulses.

9. A method of Loran radio navigation and the like, that comprises, generating a unique single cycle of radio-frequency energy and transmitting the same as an intermediate part of a several half-cycle-waveform navigation pulse, receiving the pulse transmission and selecting the unique single cycle zero crossing for timing information, said several half-cycle-waveform radio-frequency navigation pulse comprising a first half cycle of one polarity having a steep leading edge and a substantially sinusoidal trailing edge passing through zero into an opposite polarity first substantially sinusoidal half cycle of the said single cycle, and of greater amplitude, said single cycle first half cycle returning through its unique zero crossing into its second half cycle of the said one polarity, which in turn returns through zero to a further half cycle of said opposite polarity having a steep trailing edge returning to zero.

10. A method of Loran radio navigation and the like, that comprises, generating a unique single cycle of radio-frequency energy and transmitting the same as an intermediate part of a several half-cycle-waveform navigation pulse, receiving the pulse transmission and selecting the unique single cycle zero crossing for timing information, said several half-cycle-waveform radio-frequency navigation pulse comprising a first half cycle of one polarity the trailing edge of which passes through zero into an opposite polarity first substantially sinusoidal half cycle to the said single cycle and of greater amplitude, said single cycle first half cycle returning through its unique zero crossing into its second half cycle of the said one polarity, which in turn returns through zero, terminating in smaller-amplitude half cycles.

11. A method of Loran radio navigation and the like, that comprises, generating a navigation pulse comprising a single cycle of radio-frequency energy of unique sum amplitude and zero-crossing slope value and transmitting the pulse, receiving the pulse transmission, and selecting the zero crossing of the single cycle for timing information.

12. Loran radio navigation transmitter apparatus and the like having, in combination, means for storing energy, antenna circuit means, means interconnecting the storing and antenna circuit means for transferring the stored energy into the antenna circuit means to generate from part of the transferred energy a first half-cycle of radio-frequency current in the antenna circuit means, and means for feeding back the energy remaining in the antenna circuit means to the storing means to generate thereby a further half cycle of radio-frequency current in the antenna circuit means while restoring said remaining energy in said storing means for subsequent use.

13. Apparatus as claimed in claim 12 and in which said antenna circuit means is tuned to resonate following said first half-cycle generation to produce an opposite polarity half-cycle prior to feeding back the remaining energy that generates said further half-cycle, said further half cycle being of the same polarity as said first half cycle.

14. Apparatus as claimed in claim 13 and in which said antenna circuit means is adjusted so that said opposite polarity half-cycle is of greater amplitude than the first and further half cycles.

15. Apparatus as claimed in claim 13 and in which said storing means comprises first capacitor means connected through first SCR-controlled inductance means with a power source, and said interconnecting means comprises further SCR-controlled inductor means and saturable transformer means for transferring energy to said antenna circuit means under the control of the further SCR-controlled inductor means.

16. Apparatus as claimed in claim 15 and in which a spectrum-improving network section is connected between said further SCR-controlled inductor means and said saturable transformer means, said network section comprising further shunt capacitance and switch-controlled shunt resistor means.

17. Loran radio navigation transmitter apparatus and the like having, in combination, energy storing means, antenna circuit means, means for interconnecting the energy storing and antenna circuit means, trigger-controlled means for transferring energy from the storing means through the interconnecting means into the antenna circuit means to generate a single radio-frequency current cycle of unique amplitude and zero-crossing characteristics in the antenna circuit means and of substantially equal positive and negative amplitudes, means for transmitting the radio-frequency cycle as a radio navigation pulse, and means for successively operating said transferring means at preselected time intervals to generate a group of successive time-separated radio-frequency pulses.

18. Apparatus as claimed in claim 17 and in which said interconnecting and antenna circuit means are adjusted to generate said single cycle pulse intermediate a several half-cycle waveform.

19. Apparatus as claimed in claim 18 and in which the sum amplitude of the said single cycle is different from the sum amplitude of any other cycle formed out of said waveform.

20. Apparatus as claimed in claim 19 and in which the said single cycle sum amplitude is greater than the sum amplitude of any other cycle formed out of said waveform.

21. Apparatus as claimed in claim 18 and in which the slope of the said single cycle zero crossing is unique within said waveform.

* * * * *